United States Patent
Nakahara (10) Patent No.: US 8,154,036 B2
(45) Date of Patent: Apr. 10, 2012

(54) NITRIDE SEMICONDUCTOR DEVICE

(75) Inventor: Ken Nakahara, Kyoto (JP)

(73) Assignee: Rohm Co., Ltd. (JP)

( * ) Notice: Subject to any disclaimer, the term of this patent is extended or adjusted under 35 U.S.C. 154(b) by 423 days.

(21) Appl. No.: 12/223,784

(22) PCT Filed: Feb. 8, 2007

(86) PCT No.: PCT/JP2007/052264
§ 371 (c)(1),
(2), (4) Date: Aug. 8, 2008

(87) PCT Pub. No.: WO2007/091651
PCT Pub. Date: Aug. 16, 2007

(65) Prior Publication Data
US 2009/0057695 A1    Mar. 5, 2009

(30) Foreign Application Priority Data
Feb. 9, 2006 (JP) ................ 2006-032993

(51) Int. Cl.
*H01L 33/00* (2010.01)
(52) U.S. Cl. .................. 257/94; 257/E33.049
(58) Field of Classification Search .......... 257/94, 257/E33.049
See application file for complete search history.

(56) References Cited

U.S. PATENT DOCUMENTS

| | | | |
|---|---|---|---|
| 2003/0010993 A1* | 1/2003 | Nakamura et al. | 257/99 |
| 2004/0004223 A1* | 1/2004 | Nagahama et al. | 257/74 |
| 2006/0175600 A1* | 8/2006 | Sato et al. | 257/14 |

FOREIGN PATENT DOCUMENTS

| | | |
|---|---|---|
| JP | 2000-068594 | 3/2000 |
| JP | 2000-244070 | 9/2000 |
| JP | 2001-168384 | 6/2001 |
| JP | 2003-078169 | 3/2003 |
| JP | 2003-168820 | 6/2003 |
| JP | 2004-214698 | 7/2004 |
| JP | 2004-343147 | 12/2004 |
| JP | 2005-056922 | 3/2005 |
| JP | 2005-072368 | 3/2005 |
| JP | 2005-197292 | 7/2005 |
| JP | 2006-013467 | 1/2006 |
| WO | WO 03103062 A1 * | 12/2003 |

* cited by examiner

*Primary Examiner* — David S Blum
(74) *Attorney, Agent, or Firm* — Rabin & Berdo, PC (57) ABSTRACT

A nitride semiconductor device according to the present invention sequentially includes at least an n-electrode, an n-type semiconductor layer, an active layer, and a p-type semiconductor layer. The n-type semiconductor layer includes: an n-type GaN contact layer including n-type impurity-doped GaN having an electron concentration ranging from $5 \times 10^{16}$ cm$^{-3}$ to $5 \times 10^{18}$ cm$^{-3}$; the n-electrode provided on one of a main surface of the n-type GaN contact layer; and a generating layer provided on other main surface of the n-type GaN contact layer, including at least any one of $Al_xGa_{1-x}N$ (0<x<1) and $In_xGa_{1-x}N$ (0<x<1), and generates an electron accumulation layer for accumulating layer electrons at a boundary surface with the n-type GaN contact layer.

7 Claims, 11 Drawing Sheets

NITRIDE SEMICONDUCTOR DEVICE

This application is a 371 of PCT/JP2007/052264, filed Feb. 8, 2007

TECHNICAL FIELD

The present invention relates to a nitride semiconductor device, which includes at least an n-electrode, an n-type semiconductor layer, an active layer, and a p-type semiconductor layer, sequentially.

BACKGROUND ART

Heretofore, nitride semiconductor devices have been used in blue LEDs (light emitting diodes) serving as light sources for lightings, backlights, and the like, and in green LEDs serving as light sources for white lightings. Further, in a white lighting, white color is formed by using a red LED, a blue LED, and a green LED.

Figure 11:
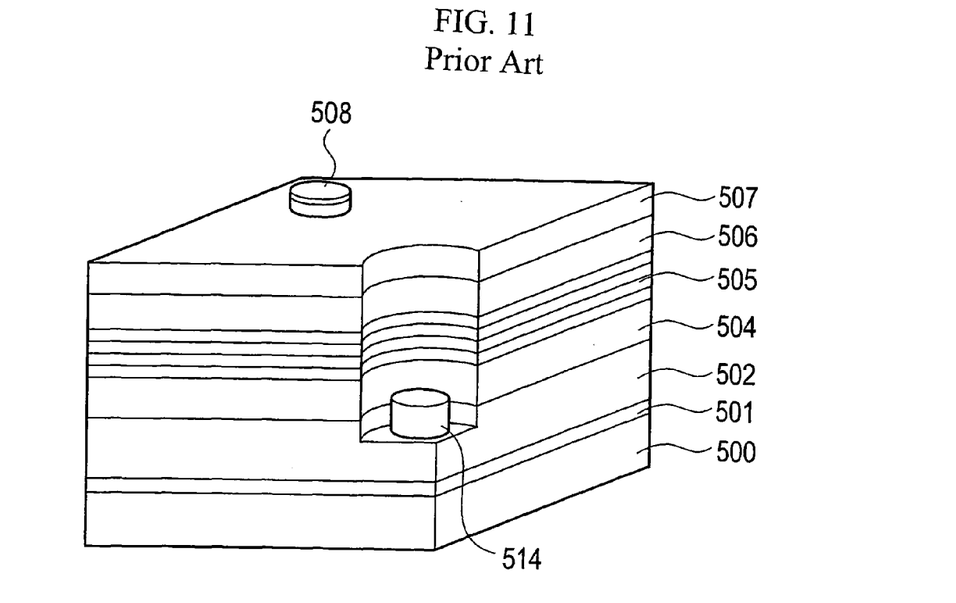
FIG. 11 is a view showing a nitride semiconductor device according to conventional art.

As shown in FIG. 11, in the nitride semiconductor device, a nitride semiconductor layer formed of an n-type semiconductor layer, an MQW active layer 505, and a p-type semiconductor layer are laminated on a substrate 500. It is preferable that the substrate 500 has conductive properties so that the substrate 500 can form a path for electric current to flow into the nitride semiconductor layer via the substrate 500. However, a substrate having conductive properties costs more as compared to a substrate not having conductive properties. For this reason, there has been considered an attempt to impart the conductive properties by doping a dopant to a substrate not having the conductive properties.

However, when the substrate 500 is doped with the dopant, a light absorption amount at the substrate 500 increases, and the characteristics of the nitride semiconductor device are thereby affected. Accordingly, a substrate not having conductive properties and not doped with any dopant is generally used (for example, a sapphire substrate or the like) as the substrate 500.

When a substrate not having the conductive properties and not doped with any dopant is used as the substrate 500, the nitride semiconductor device needs to have a path through which electric current flows, on one of a main surface side of the substrate 500.

Specifically, as shown in FIG. 11, the nitride semiconductor layer (an n-type buffer layer 501, an n-type contact layer 502, an n-type clad layer 504, an MOW active layer 505, a p-type clad layer 506, and a p-type contact layer 507) is laminated on the substrate 500, and then a part of the nitride semiconductor layer is etched from the p-type contact layer 507 side, until an n-type contact layer 502 is exposed. Next, an n-electrode 514 is formed on a main surface of the exposed n-type contact layer 502. Further, a p-electrode 508 is formed on a main surface of the p-type contact layer 507. Thereby a nitride semiconductor device, which contains a path between the n-electrode 514 and the p-electrode 508 through which the electric current flows without passing through the substrate 500 there between, can be formed.

Figure 12:
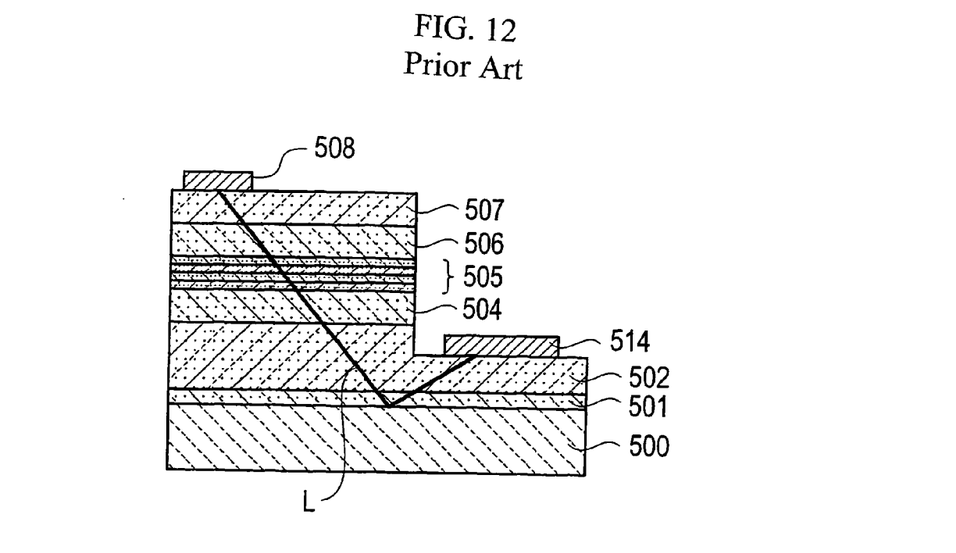
FIG. 12 is a view showing the sectional structure of the nitride semiconductor device according to the conventional art.

However, it is a characteristic of the electric current that the electric current flows a shorter path under the same resistance value. Therefore, in the conventional nitride semiconductor device as shown in FIG. 12, the electric current is concentrated in a portion corresponding to a line L from the p-electrode 508 to the n-electrode 514 when electric current is caused to flow between the n-electrode 514 and the p-electrode 508. This leads to a problem that the electric current does not flow evenly throughout each layer of the nitride semiconductor device.

As a result, it has been difficult to evenly emit the light from the MQW active layer 505 of the nitride semiconductor device.

Moreover, according to the above-described nitride semiconductor device, since an electric voltage is concentrated in the portion corresponding to the line L from the p-electrode 508 to the n-electrode 514 in the same manner as the flow of the electric current. This leads to a problem that an electrostatic breakdown tends to occur in the corresponding portion.

In addition, according to the above-described nitride semiconductor device, since the p-electrode 508 and the n-electrode 514 are formed on one of a main surface side of the substrate 500, a problem arises that a chip area required for the nitride semiconductor device increases as compared to a nitride semiconductor device having an n-electrode formed on one of the main surface side of a substrate and a p-electrode formed on the other main surface side thereof. Accordingly, a productivity of the nitride semiconductor decreases.

In order to solve the above problems, a method of manufacturing a counter electrode type nitride semiconductor device has been proposed. In this proposed method, a nitride semiconductor layer is laminated on a substrate, and a p-electrode is formed on one of the main surface of the nitride semiconductor layer, the nitride semiconductor layer is then separated from the substrate, and an n-electrode is formed on a main surface on the opposite side of the surface on which the p-electrode of the nitride semiconductor layer is formed.

Specifically, in an example of a counter electrode type nitride semiconductor device using a substrate made of sapphire and a nitride semiconductor layer made of a GaN-based semiconductor, the nitride semiconductor layer is laminated on the substrate, and a p-electrode is formed on a main surface of the nitride semiconductor layer.

Next, the nitride semiconductor layer side is irradiated from the substrate side with excimer laser light having a wavelength of approximately 300 nm or less with irradiation energy of several hundred mJ/cm². Thereby, the nitride semiconductor layer is thermally decomposed near a boundary surface of the substrate and the nitride semiconductor layer, to separate the nitride semiconductor layer from the substrate, thereby forming an n-electrode on an exposed main surface of the nitride semiconductor layer.

The method of manufacturing a nitride semiconductor device for obtaining the counter electrode type nitride semiconductor device in this manner has been disclosed (for example, see Japanese Patent Application Publication No. 2003-168820).

Using the above manufacturing method makes it possible to obtain a counter electrode type nitride semiconductor device, which forms a p-electrode on one of the main surface of a nitride semiconductor layer and an n-electrode is formed on the other main surface thereof, in a same manner as a substrate having the conductive properties. Therefore, a nitride semiconductor device having an improved light extraction efficiency can be manufactured.

DISCLOSURE OF THE INVENTION

Figure 13:
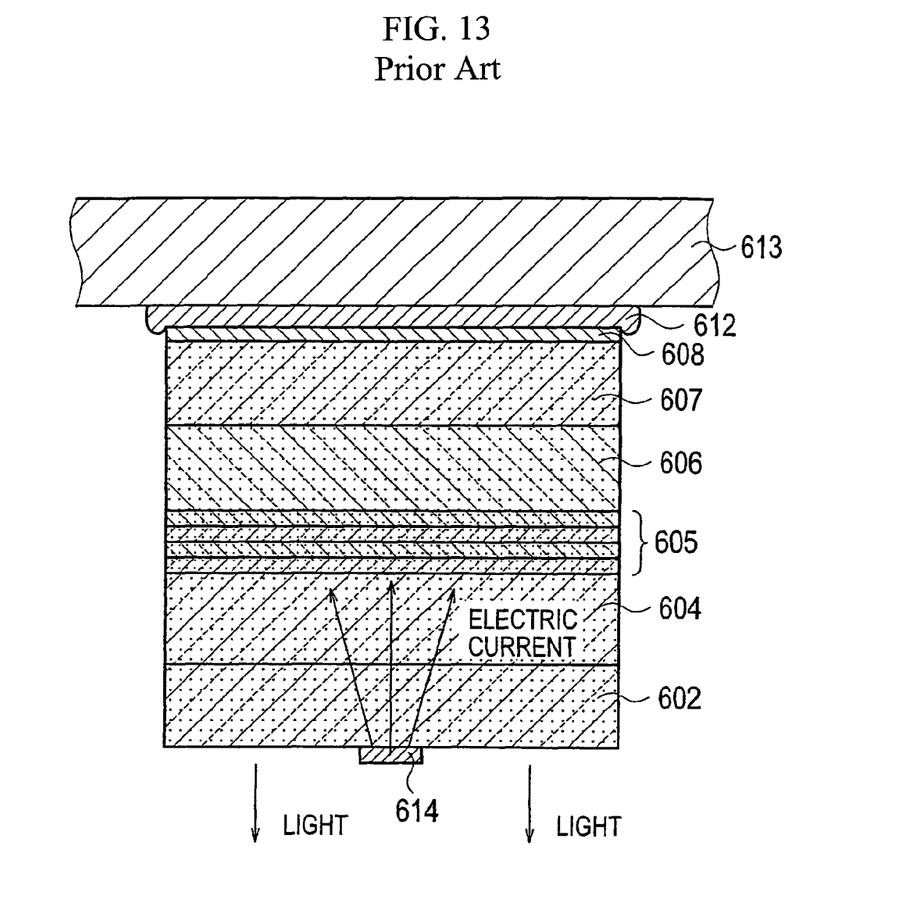
FIG. 13 is a view showing the sectional structure of a nitride semiconductor device according to conventional art.

However, as shown in FIG. 13, a nitride semiconductor device produced by the above-described manufacturing method only contains an n-type contact layer 602 and an n-type clad layer 604 between an n-electrode 614 and an MQW active layer 605, as well as a p-type clad layer 606, a p-type contact layer 607, a transparent electrode 608, an adhesive film 612, and a supporting substrate 613, since a substrate is separated from the nitride semiconductor layer. Accordingly, the distance from the n-electrode 614 to the MQW active layer 605 of the nitride semiconductor device is only several μm, which is short as compared to the width of the n-type contact layer 602 and the n-type clad layer 604.

Consequently, in the n-type semiconductor layer, a large difference arises between the linear distance from the n-electrode 614 to the MQW active layer 605, and a distance to reach from the n-electrode 614 to the MQW active layer 605 while diffusing in approximately horizontal directions in relation to the crystal growth direction.

In the nitride semiconductor device, the electric current has a characteristic of flowing a shorter path under the same resistance value. This leads to a problem that the electric current does not diffuse uniformly in the approximately horizontal directions in relation to the crystal growth direction between the n-electrode 614 and the MQW active layer 605, when the electric current is caused to flow between the n-electrode 614 and a p-electrode 608. On the contrary, the electric current is likely to flow linearly.

Moreover, the nitride semiconductor device has a problem that the MQW active layer 605 has difficulty in emitting light evenly, since the electric current diffused uniformly hardly flows up to the MQW active layer 605.

In order to solve the above problems, there has been proposed to increase an area of the n-electrode 614 so that the electric current diffuses uniformly and flows up to the MQW active layer 605. However, this causes a problem of decreasing a light extraction efficiency of the nitride semiconductor device, since increasing the area of the n-electrode 614 causes the light emitted from the n-type contact layer 602 to be blocked.

Further, there has also been proposed to increase a thicknesses of the respective layers of the n-type semiconductor layer between the n-electrode 614 and the MQW active layer 605, so as to make a distance from the n-electrode 614 to the MQW active layer 605 long enough so that the electric current can flow up to the MQW active layer 605 while diffusing uniformly. However, this causes a problem of increasing the time for a crystal growth and thereby increasing the manufacture cost. Moreover, since the distance to the substrate from a supporting substrate that supports the nitride semiconductor layer increases, when the nitride semiconductor layer is separated from the substrate, a stress applied on the nitride semiconductor layer increases and causes damages in the nitride semiconductor layer.

Furthermore, there has also been proposed to increase a dope amount of n-type impurities to reduce the resistance value of the n-type semiconductor layer. However, this leas to a deterioration of the light emitting characteristics, since a crystallinity in the n-type semiconductor layer is deteriorated by increasing a dope amount of, for example, Si, and thereby a quality of the MQW active layer 605 formed by crystal growth on the n-type semiconductor layer is deteriorated.

The present invention has been made in view of the above-described problems, and has an object of providing a nitride semiconductor device, which has enhanced luminescence characteristics and a thin layer thickness of an n-type semiconductor layer between an n-electrode and an active layer.

A first aspect of the present invention is summarized as a nitride semiconductor device sequentially including at least an n-electrode, an n-type semiconductor layer, an active layer, and a p-type semiconductor layer, wherein the n-type semiconductor layer includes: an n-type GaN contact layer including n-type impurity-doped GaN having an electron concentration ranging from $5 \times 10^{16}$ cm$^{-3}$ to $5 \times 10^{18}$ cm$^{-3}$; the n-electrode provided on one of the main surface of the n-type GaN contact layer; and a generating layer provided on other main surface of the n-type GaN contact layer, including at least any one of $Al_xGa_{1-x}N$ (0<x<1) and $In_xGa_{1-x}N$ (0<x<1), and generates an electron accumulation layer for accumulating layer electrons at a boundary surface with the n-type GaN contact layer.

According to the first aspect of the invention, the generating layer including at least any one of $Al_xGa_{1-x}N$ (0<x<1) and $In_xGa_{1-x}N$ (0<x<1) is provided on the n-type GaN contact layer including the n-type impurity-doped GaN having an electron concentration ranging from $5 \times 10^{16}$ cm$^{-3}$ to $5 \times 10^{18}$ cm$^{-3}$. Thereby, when an electric current is caused to flow between the n-electrode and the p-electrode, the electron accumulation layer can be generated at the boundary surface between the n-type GaN contact layer and the generating layer. The electron accumulation layer accumulates electrons two-dimensionally near the boundary surface between the n-type GaN contact layer and the generating layer and allows the electric current to easily flow because of low resistance.

Accordingly, when the electric current flows between the n-electrode and the p-electrode in the nitride semiconductor device, the electric current which has flowed from the n-electrode diffuses approximately in the horizontal direction with respect to the crystal growth direction in the electron accumulation layer to promptly diffuse in the entire electron accumulation layer. The electric current diffused in the electron accumulation layer via the electron accumulation layer flows uniformly to the active layer, thereby allowing the active layer to emit light evenly. Thus, since the electric current can be diffused evenly in the electron accumulation layer, the nitride semiconductor device, which has enhanced luminescence and a thin layer thickness of the n-type semiconductor layer between the n-electrode and the active layer, can be obtained.

In the first aspect of the invention, the generating layer may have a superlattice structure in which an $Al_xGa_{1-x}N$ (0<x<1) layer and an $Al_yGa_{1-y}N$ (0≦y<1, y<x) layer, which have different composition formulas from one another, are alternately laminated on each other, and each of a thickness of the $Al_xGa_{1-x}N$ layer and the $Al_yGa_{1-y}N$ layer may be equal to or less than 30 nm.

Further, the generating layer may have a superlattice structure in which an $In_xGa_{1-x}N$ (0<x<1) layer and an $Al_yGa_{1-y}N$ (0<y<1) layer are alternately laminated on each other, and each of a thickness of the $In_xGa_{1-x}N$ layer and the $Al_yGa_{1-y}N$ layer may be equal to or less than 30 nm.

Moreover, the generating layer may have a superlattice structure in which an $In_xGa_{1-x}N$ (0<x<1) layer and an $In_yGa_{1-y}N$ (0≦y<1, y<x) layer, which have different composition formulas from one another, are alternately laminated on each other, and each of a thickness of the $In_xGa_{1-x}N$ layer and the $In_yGa_{1-y}N$ layer may be equal to or less than 30 nm.

According to this aspect, the generating layer has the superlattice structure and the thickness per layer is less than or equal to 30 nm. Accordingly, the electrons are further accumulated two-dimensionally near the boundary surface between the n-type GaN contact layer and the generating layer, and the electron accumulation layer having low resistance can be generated. Accordingly, the nitride semiconductor device, which has enhanced luminescence characteristics and a thin layer thickness of the n-type semiconductor layer between the n-electrode and the active layer, can be obtained.

BEST MODE FOR CARRYING OUT THE INVENTION

Next, embodiments of the present invention will be described with reference to the accompanying drawings. Note that the same or similar portions are denoted by the same or similar reference numerals in the descriptions of the drawings below. However, it should be noted that the drawings are merely schematic representations, and that the ratios of the respective dimensions and the like differ from the actual ones.

Thus, specific dimensions and the like should be determined in consideration of the descriptions to be given below. It is obvious that there may be differences in relations and ratios of the dimensions among the drawings.

(Configuration of Nitride Semiconductor Device According to First Embodiment of the Present Invention)

Figure 1:
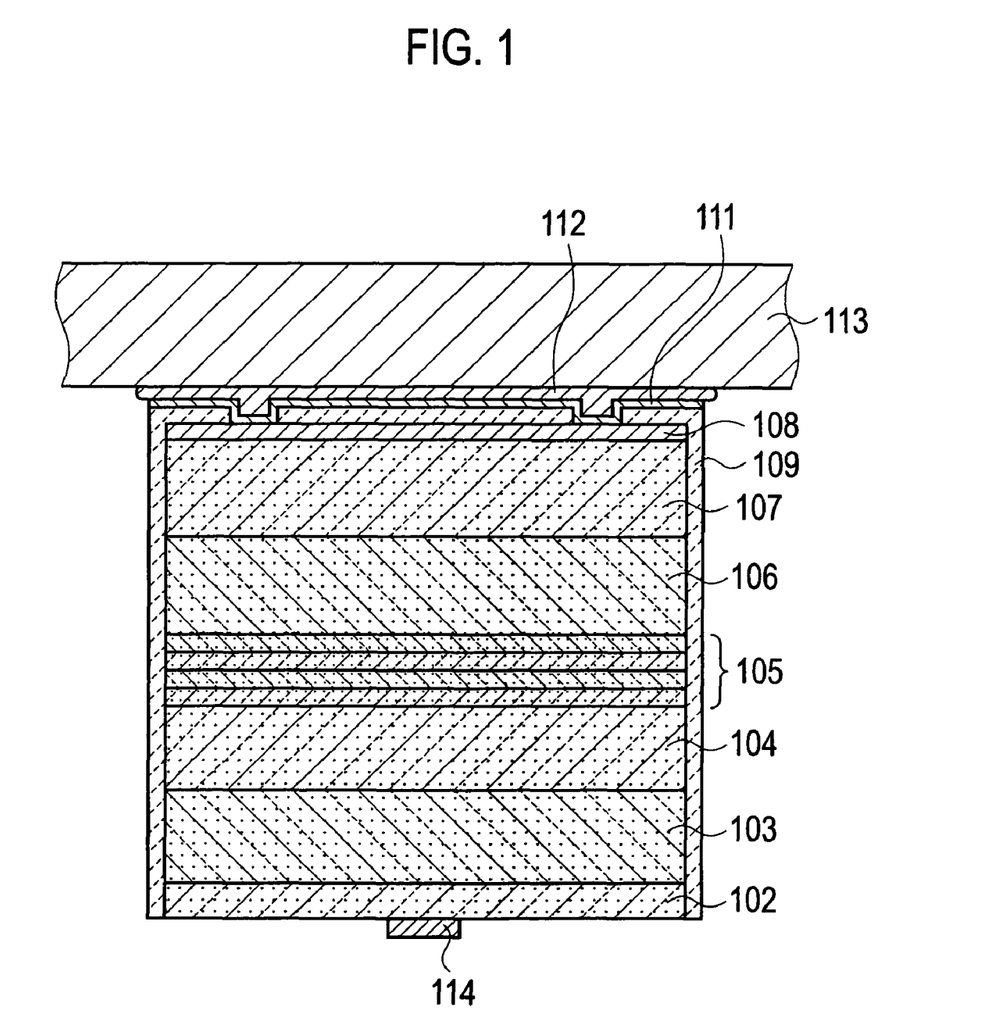
FIG. 1 is a view showing a sectional structure of a nitride semiconductor device according to a first embodiment of the present invention.

A nitride semiconductor device according to a first embodiment of the present invention will be described with reference to FIG. 1. FIG. 1 shows the sectional structure of the nitride semiconductor device according to the first embodiment of the present invention. As an example of the nitride semiconductor device according to this embodiment, a description will be given of a blue LED used as a light source and a blue LED and green LED used as light sources for white lighting.

As shown in FIG. 1, the nitride semiconductor device according to this embodiment includes a nitride semiconductor layer in which an n-type semiconductor layer, an MQW active layer 105, and a p-type semiconductor layer are laminated.

In the nitride semiconductor device according to the first embodiment, the n-type semiconductor layer is a nitride semiconductor layer laminated between an n-electrode 114 and the MQW active layer 105, and includes an n-type GaN contact layer 102, an n-type AlGaN layer 103, and an n-type clad layer 104.

The n-type semiconductor layer includes: the n-type GaN contact layer 102 formed of an n-type impurity-doped GaN having an electron concentration ranging from $5 \times 10^{16}$ cm$^{-3}$ to $5 \times 10^{18}$ cm$^{-3}$; the n-electrode 114 provided on one of the main surface of the n-type GaN contact layer 102; and a generating layer provided on the other main surface of the n-type GaN contact layer 102 and is formed of Al$_x$Ga$_{1-x}$N (0<x<1). Here, the generating layer generates an electron accumulation layer which accumulates electrons at the boundary surface with the n-type GaN contact layer 102.

In the nitride semiconductor device according to the first embodiment, the p-type semiconductor layer is a nitride semiconductor layer laminated between a transparent electrode 108 and the MQW active layer 105, and includes a p-type clad layer 106 and a p-type contact layer 107.

The p-type semiconductor layer includes the transparent electrode 108 as a p-electrode, on one of the main surface of the p-type contact layer 107.

The nitride semiconductor device also includes a reflecting mirror film 111 on the transparent electrode 108, whereby a light emitted from the MQW active layer is reflected by the reflecting mirror film 111 to further improve luminescence characteristics on a light emitted from the n-type GaN contact layer 102.

The nitride semiconductor device also includes a supporting substrate 113 bonded to the reflecting mirror film 111 with an adhesive film 112 interposed therebetween.

On the side surface of the nitride semiconductor layer, an insulating film 109 formed of SiN or the like is formed.

The n-electrode 114 has a Ti layer and an Al layer laminated sequentially on one of the main surface (hereinafter referred to as "lower surface." The lower surface denotes the surface on which the n-type AlGaN layer 103 is not laminated in the n-type GaN contact layer 102 of the nitride semiconductor device according to this embodiment) of the n-type GaN contact layer 102, and is in ohmic contact with the n-type GaN contact layer 102. Note that the n-electrode 114 may be formed of only the Al layer.

The transparent electrode 108 is a p-electrode formed of ZnO, on one of the main surface (hereinafter referred to as "upper surface." The upper surface denotes the surface on which the p-type clad layer 106 is not laminated in the p-type contact layer 107 of the nitride semiconductor device according to this embodiment) of the p-type contact layer 107.

The n-type GaN contact layer 102 is formed of the n-type impurity-doped GaN having an electron concentration ranging from $5 \times 10^{16}$ cm$^{-3}$ to $5 \times 10^{18}$ cm$^{-3}$. The electron concentration of the n-type GaN contact layer 102 is preferably ranging from $5 \times 10^{16}$ cm$^{-3}$ to $1 \times 10^{18}$ cm$^{-3}$.

As the n-type impurity doping, Si doping or the like is used, for example.

Further, the n-type GaN contact layer 102 may have a superlattice structure in which the thickness per layer is less than or equal to 10 nm. In this example, the thickness per layer of the n-type GaN contact layer 102 is preferably less than or equal to 5 nm.

The n-type AlGaN layer 103 is formed of Al$_{0.08}$GaN doped with Si, and functions as the generating layer for generating the electron accumulation layer that accumulates electrons. Note that the composition of the n-type AlGaN layer 103 is not limited to Al$_{0.08}$GaN, as long as Al$_x$Ga$_{1-x}$N (0<x<1) is satisfied (the same is assumed for the n-type AlGaN layer 103 hereinafter).

The n-type clad layer 104 is formed of Si-doped GaN.

The MQW active layer 105 has a multi quantum well structure (MQW structure) formed by a nitride semiconductor including In.

Specifically, the MQW active layer 105 has an MQW structure in which a well layer formed of $In_{0.17}GaN$ with a thickness of 3 nm and a barrier layer formed of undoped GaN with a thickness of 10 nm are alternately laminated eight times, respectively.

The p-type clad layer 106 is formed of undoped GaN or $In_{0.01}GaN$ including approximately 1% of In.

The p-type contact layer 107 is formed of GaN doped with Mg. Note that the p-type contact layer 107 is in ohmic contact with the transparent electrode 108.

(Method of Manufacturing Nitride Semiconductor Device According to First Embodiment of the Present Invention)

Processes to be performed in a method of manufacturing the nitride semiconductor device according to this embodiment will be described below with reference to FIGS. 2 to 5.

Figure 2:
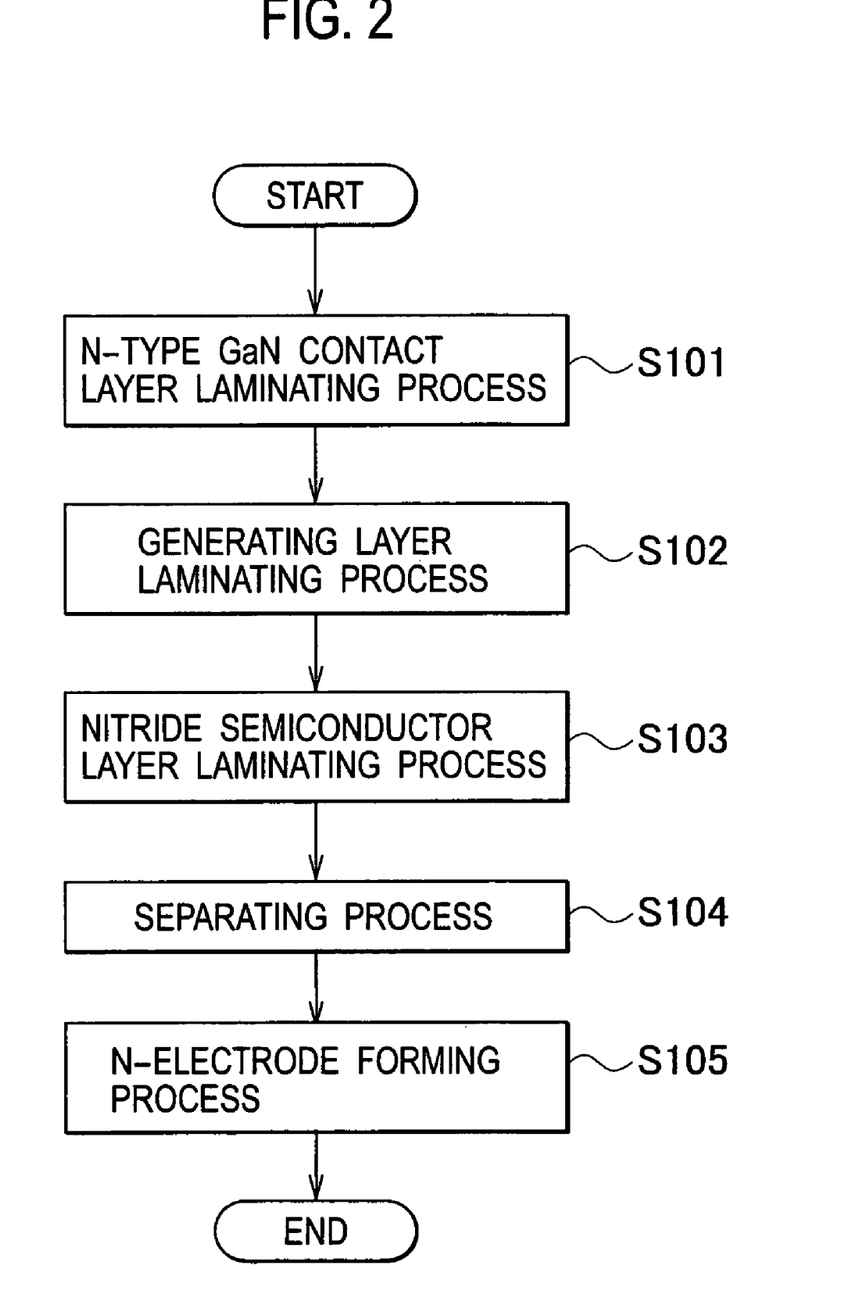
FIG. 2 shows a flowchart of a method of manufacturing the nitride semiconductor device according to the first embodiment of the present invention.
Figure 3:
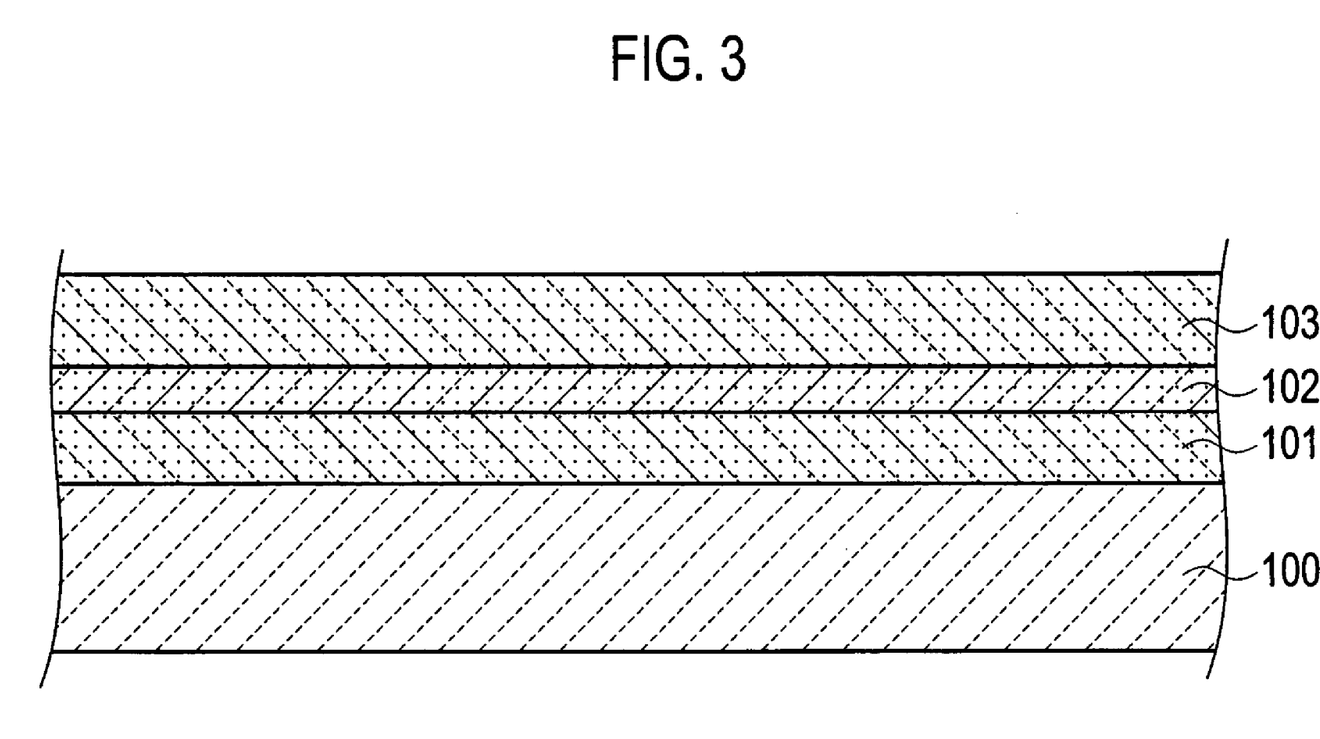
FIG. 3 shows the method of manufacturing the nitride semiconductor device according to the first embodiment of the present invention.

As shown in FIGS. 2 and 3, in step S101, a process of laminating an n-type GaN contact layer is performed. In this process, the n-type GaN contact layer 102 is formed by a crystal growth on a substrate formed of sapphire (hereinafter referred to as a "substrate 100").

To be more specific, in this embodiment, the substrate 100 is firstly put in a metal organic chemical vapor deposition (MOCVD) device, and a thermal cleaning is performed on the substrate 100 by increasing the temperature to approximately 1050° C. while causing hydrogen gas to flow.

Secondly, the temperature in the MOCVD device is reduced to approximately 600° C., and a crystal growth of an n-type buffer layer 101 is performed on the substrate 100 by an epitaxial growth (hereinafter referred to simply as "crystal growth").

Thirdly, the temperature in the MOCVD device is increased again to approximately 1000° C., to form the n-type GaN contact layer 102 by the crystal growth, on the n-type buffer layer 101. The n-type GaN contact layer 102 is formed of Si-doped GaN having an electron concentration ranging from $5×10^{16}$ $cm^{-3}$ to $5×10^{18}$ $cm^{-3}$. The electron concentration of the n-type GaN contact layer 102 is preferably ranging from $5×10^{16}$ $cm^{-3}$ to $1×10^{18}$ $cm^{-3}$.

In step S102, a process of laminating a generating layer formed of AlGaN is performed. The generating layer generates the electron accumulation layer which accumulates electrons at the boundary surface with the n-type GaN contact layer 102.

Specifically, in the process of laminating the generating layer, the n-type AlGaN layer 103 is formed by the crystal growth, on the n-type GaN contact layer 102. Here, the n-type AlGaN layer 103 is formed of $Al_{0.08}GaN$ doped with Si and functioning as the generating layer that generates the electron accumulation layer.

FIG. 3 shows a sectional view of the nitride semiconductor device after the process of laminating the generating layer laminating is performed.

In step S103, a process of laminating the nitride semiconductor layer on the n-type AlGaN layer 103 is performed.

Figure 4:
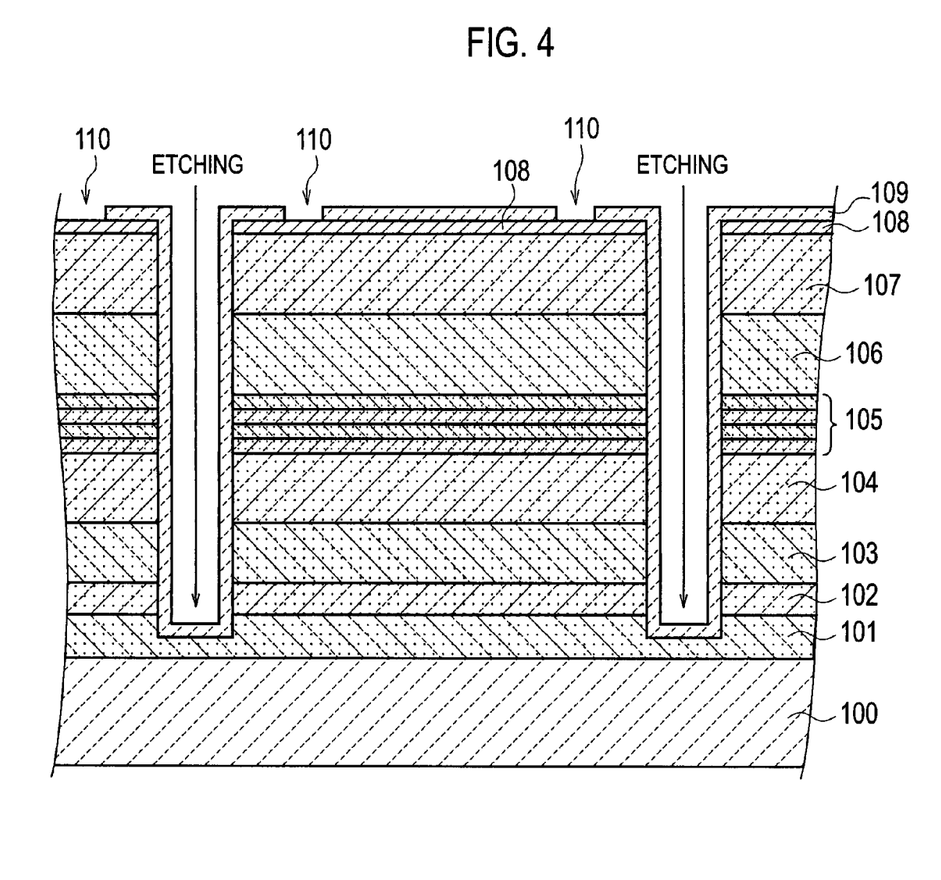
FIG. 4 shows the method of manufacturing the nitride semiconductor device according to the first embodiment of the present invention.

Specifically, in the process of laminating the nitride semiconductor layer on the n-type AlGaN layer 103, the n-type clad layer 104 formed of Si-doped GaN is firstly formed by the crystal growth, on the n-type AlGaN layer 103. The n-type semiconductor layer is laminated by the crystal growth of the n-type clad layer 104.

Secondly, the MQW active layer 105 having the MQW structure is formed by the crystal growth, by respectively laminating eight times, on the n-type clad layer 104, a well layer formed of $In_{0.17}GaN$ with a thickness of 3 nm, and a barrier layer formed of undoped GaN with a thickness of 10 nm.

Thirdly, on the MQW active layer 105, the p-type clad layer 106 formed of an undoped GaN layer or a InGaN layer having an In composition of approximately 1% is formed by the crystal growth.

Fourthly, on the p-type clad layer 106, the p-type contact layer 107 formed of Mg-doped GaN is formed by the crystal growth while further increasing the temperature in the MOCVD device. The p-type semiconductor layer is laminated by the crystal growth of the p-type contact layer 107.

Fifthly, on the p-type contact layer 107, by using a molecular beam epitaxy method, the transparent electrode 108 formed of Ga-doped ZnO having a low resistance of about $2×10^{-4}$ $\Omega cm$, is formed.

Sixthly, by etching from the transparent electrode 108 up to the nitride semiconductor layer, a cut groove for dividing the nitride semiconductor layer into sizes of the nitride semiconductor devices, is formed.

To be more specific, the cut groove can be formed by etching the nitride semiconductor layer and the transparent electrode 108, until the n-type buffer layer 101 is exposed from the transparent electrode 108, by an inductively coupled plasma (ICP) method or the like, after forming a dielectric film formed of $SiO_2$ or the like or a resist mask on the transparent electrode 108.

Seventhly, on an exposed surface such as the side surface of the transparent electrode 108 and the nitride semiconductor layer, the insulating film 109 formed of SiN or the like is formed, by using plasma chemical vapor deposition (P-CVD) or sputtering.

Eighthly, a contact hole 110 is formed by performing a dry-etching on the insulating film 109 by use of a $CF_4$-based gas. The insulating film 109 is formed on the transparent electrode 108

Note that, when the dry-etching is performed, only the transparent electrode 108 can be etched since an etching rate of the transparent electrode 108 formed of ZnO is low. By adopting this manner, the other layers can be protected.

FIG. 4 shows a sectional view of the nitride semiconductor device after the nitride semiconductor layer laminating process is performed.

In step S104, a process of separating the nitride semiconductor layer from the substrate 100 is performed.

Figure 5:
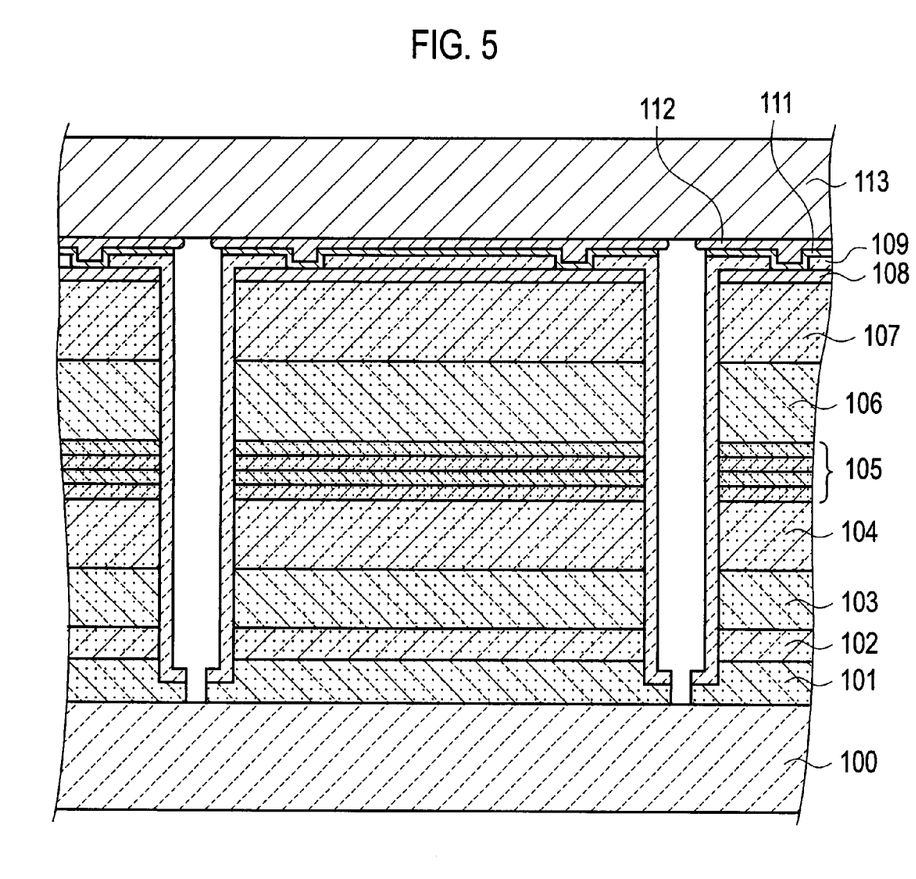
FIG. 5 shows the method of manufacturing the nitride semiconductor device according to the first embodiment of the present invention.

Specifically, the reflecting mirror film 111 is firstly formed by laminating sequentially an Al layer, a Ti layer, and an Au layer on the insulating film 109. The insulating film 109 is formed on the transparent electrode 108 and the p-type contact layer 107, which are exposed from the contact hole 110. After the Au layer is laminated, It is preferable to apply a patterning in accordance with the shape of the nitride semiconductor device, and to perform Au plating of several μm by an electrolytic plating.

Note that a layer of other silver white metals such as an Ag layer may also be used instead of the Al layer. An alloy layer of Au and Sn may also be used instead of the Au layer. The Au layer may also be laminated directly on the Al layer without using the Ti layer.

Secondly, the etching is performed on the same portions as the etching for forming the cut groove for dividing the nitride semiconductor layer into sizes of the nitride semiconductor devices, until the substrate 100 is exposed. Note that a p-n junction section of the nitride semiconductor layer is protected by the insulating film 109, and is thus not damaged unnecessarily by the etching.

Thirdly, the adhesive film 112 formed of an alloy layer of Au and Sn or only an Au layer is applied to the supporting substrate 113 formed of a highly heat conductive material such as Cu and AlN. A part of the adhesive film 112 is melted by heat, and the reflecting mirror film 111 and the supporting substrate 113 are pressure-bonded.

In the pressure bonding, the supporting substrate 113 and the nitride semiconductor layer are preferably sandwiched by a device formed of carbon at a temperature of approximately 400° C. Accordingly, since a thermal expansion of carbon is small, an expansion force, which is as big as the nitride semiconductor layer and the supporting substrate 113, can perform an optimal bonding.

FIG. 5 shows a sectional view of the nitride semiconductor device after the pressure bonding of the reflecting mirror film 111 and the supporting substrate 113 by the process of separating.

Fourthly, the nitride semiconductor layer is irradiated from the substrate 100 side with a KrF laser light having a wavelength of approximately 248 nm with irradiation energy of approximately 300 to 400 J/cm$^{-2}$. Therefore, the n-type buffer layer 101 near the boundary surface between the substrate 100 and the n-type buffer layer 101 is thermally decomposed, and the n-type buffer layer 101 is separated from the nitride semiconductor layer from the substrate 100.

The KrF laser light transmits through the substrate 100 formed of sapphire almost completely, and is almost completely absorbed by the n-type buffer layer 101 formed of GaN. Accordingly, the temperature of the n-type buffer layer 101 near the boundary surface of the substrate 100 and the n-type buffer layer 101 rapidly increases, whereby the n-type buffer layer 101 is thermally decomposed.

Note that $N_2$ gas generated at the time of the thermal decomposition flows to gaps between the nitride semiconductor layers, and does not apply any pressure to the nitride semiconductor layer, whereby a problem such as a crack in the nitride semiconductor layer is not caused.

In step S105, a process of forming the n-electrode 114 on the lower surface of the nitride semiconductor layer is performed.

Specifically, Ga remaining on the lower surface of the n-type GaN contact layer 102 is firstly removed by performing an etching with acid, alkali, or the like through the process of separating. It is preferable to further perform a dry-etching after the etching with alkali or the like, so as to etch the n-type GaN contact layer 102. By performing the dry-etching, an ohmic characteristics of the n-type GaN contact layer 102 and the n-electrode 114 is further improved.

Secondly, a Ti layer and an Al layer are laminated sequentially on the lower surface of the n-type GaN contact layer 102 to form the n-electrode 114. The n-electrode 114 is in ohmic contact with the lower surface of the n-type GaN contact layer 102. Note that the n-electrode 114 can be formed by laminating only the Al layer without using the Ti layer.

Accordingly, the nitride semiconductor device shown in FIG. 1 is completed.

(Operation/Effect of Nitride Semiconductor Device According to First Embodiment of the Present Invention)

Figure 6:
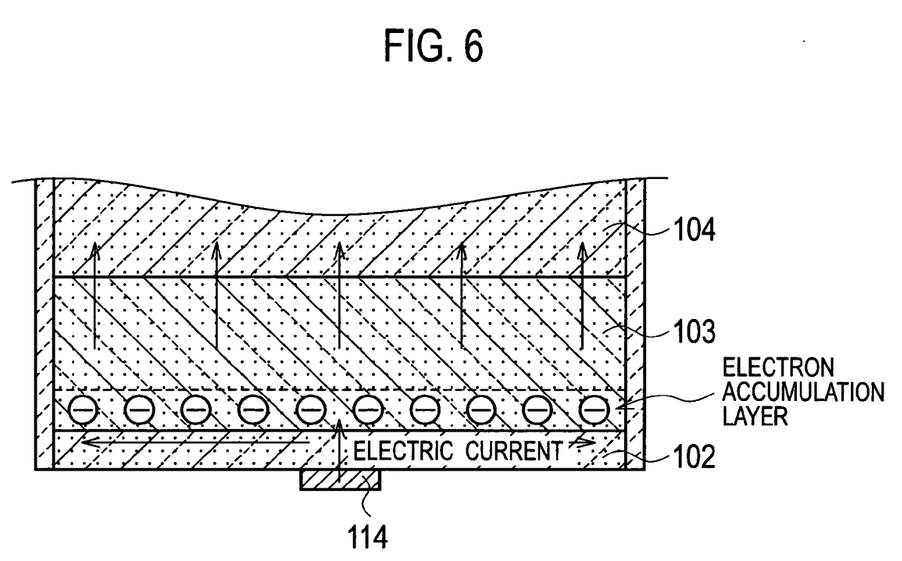
FIG. 6 is a view for illustrating an electron accumulation layer of the nitride semiconductor device according to the first embodiment of the present invention.

As shown in FIG. 6, in the nitride semiconductor device according to this embodiment, the n-type semiconductor layer includes the n-type GaN contact layer 102 formed of n-type impurity-doped GaN having an electron concentration ranging from $5\times10^{16}$ cm$^{-3}$ to $5\times10^{18}$ cm$^{-3}$, and, on the n-type GaN contact layer 102, the n-type AlGaN layer 103 serving as the generating layer formed of AlGaN, which generates the electron accumulation layer for accumulating electrons at the boundary surface with the n-type GaN contact layer 102.

Therefore, when the electric current flows between the n-electrode 114 and the transparent electrode 108, and when the transparent electrode 108 is the p-electrode, the n-type AlGaN layer 103 functions as the generating layer which generates the electron accumulation layer, and the electron accumulation layer can be generated at the boundary surface of the n-type GaN contact layer 102 and the n-type AlGaN layer 103.

The electron accumulation layer thus generated accumulates the electrons two-dimensionally near the boundary surface of the n-type GaN contact layer 102 and the n-type AlGaN layer 103, and facilitates the electric current to flow due to low resistance.

Accordingly, the electric current from the n-electrode 114 diffuses into the entire electron accumulation layer promptly approximately in the horizontal direction in relation to the crystal growth direction, when the electric current flows between the n-electrode 114 and the transparent electrode 108 in the nitride semiconductor device. The electric current diffused via the electron accumulation layer uniformly flows to the MQW active layer 105 and diffuses in the entire nitride semiconductor layer, thus allowing the MQW active layer 105 to emit the light evenly. Accordingly, the nitride semiconductor device, which has enhanced luminescence characteristics and a thin layer thickness of the n-type semiconductor layer between the n-electrode 114 and the NQW active layer 105, can be obtained.

The electron concentration of the n-type GaN contact layer 102 is preferably ranging from $5\times10^{16}$ cm$^{-3}$ to $1\times10^{18}$ cm$^{-3}$, whereby the brightness of the nitride semiconductor device can further be improved.

(Nitride Semiconductor Device According to Second Embodiment of the Present Invention)

Figure 7:
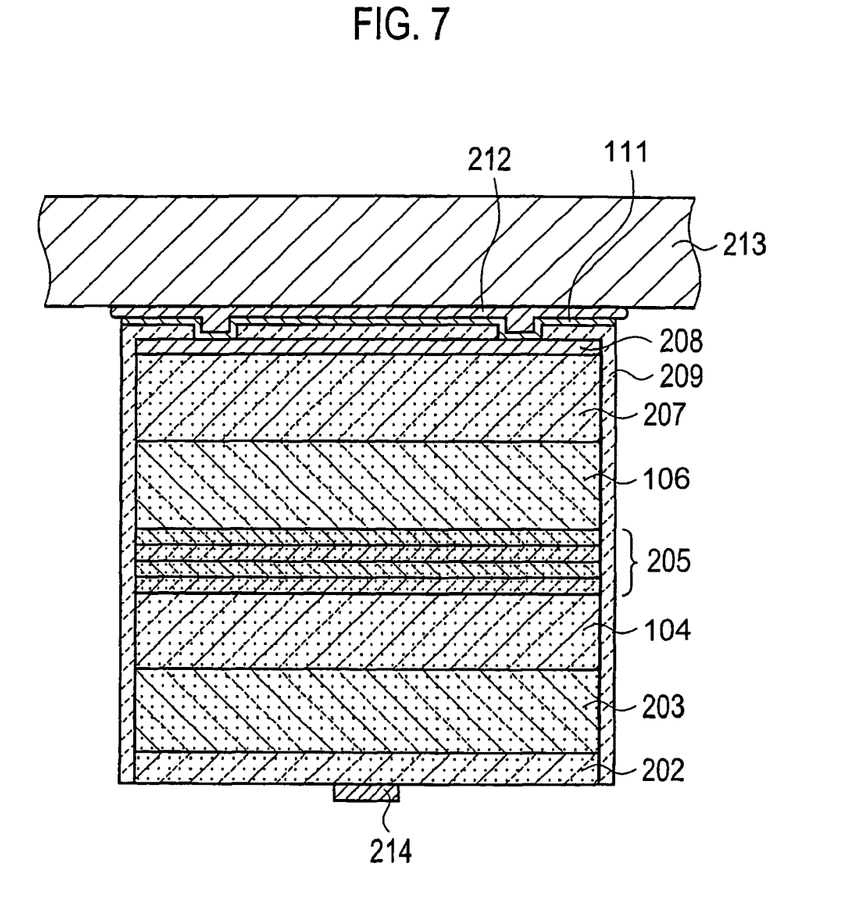
FIG. 7 is a view showing the sectional structure of a nitride semiconductor device according to a second embodiment of the present invention.

A nitride semiconductor device according to a second embodiment of the present invention will further be described below with reference to FIG. 7.

Note that the differences from the first embodiment described above will mainly be described below.

In the first embodiment, the n-type AlGaN layer 103, which is formed of Si-doped $Al_{0.08}GaN$ and generates the electron accumulation layer, is formed as the generating layer on the n-type GaN contact layer 102.

In contrast, in the second embodiment, an n-type InGaN layer 203 formed of $In_xGa_{1-x}N$ (0<x<1) is formed as the generating layer on an n-type GaN contact layer 202.

For example, the n-type InGaN layer 203 is formed of Si-doped $In_{0.05}GaN$.

Note that the composition of the n-type InGaN layer 203 is not limited to $In_{0.05}GaN$, as long as $In_xGa_{1-x}N$ (0<x<1) is satisfied (the same is assumed for the n-type InGaN layer 203 hereinafter).

The n-type semiconductor layer includes the n-type GaN contact layer 202 formed of Si-doped GaN having an electron concentration ranging from $5\times10^{16}$ cm$^{-3}$ to $5\times10^{18}$ cm$^{-3}$, and, on the n-type GaN contact layer 202, the n-type InGaN layer 203 serving as the generating layer formed of InGaN, which generates an electron accumulation layer for accumulating electrons at the boundary surface with the n-type GaN contact layer 202. Therefore, when the electric current flows between an n-electrode 214 and a transparent electrode 208, and when the transparent electrode 208 is a p-electrode, the n-type InGaN layer 203 functions as the generating layer which generates the electron accumulation layer. Accordingly, the electron can be further accumulated two-dimensionally near the boundary surface of the n-type GaN contact layer 202 and the n-type InGaN layer 203, and the electron accumulation layer having low resistance can be generated.

Accordingly, the electric current from the n-electrode 214 diffuses into the entire electron accumulation layer promptly approximately in the horizontal direction in relation to the crystal growth direction, when the electric current flows between the n-electrode 214 and the transparent electrode 208 in the nitride semiconductor device. The electric current diffused via the electron accumulation layer uniformly flows to the MQW active layer 205 and diffuses in the entire nitride semiconductor layer, thus allowing the MQW active layer 205 to emit the light evenly. Accordingly, the nitride semiconductor device, which has enhanced luminescence characteristics and a thin layer thickness of the n-type semiconductor layer between the n-electrode 214 and the NQW active layer 205, can be obtained.

(Nitride Semiconductor Device According to Third Embodiment of the Present Invention)

Figure 8:
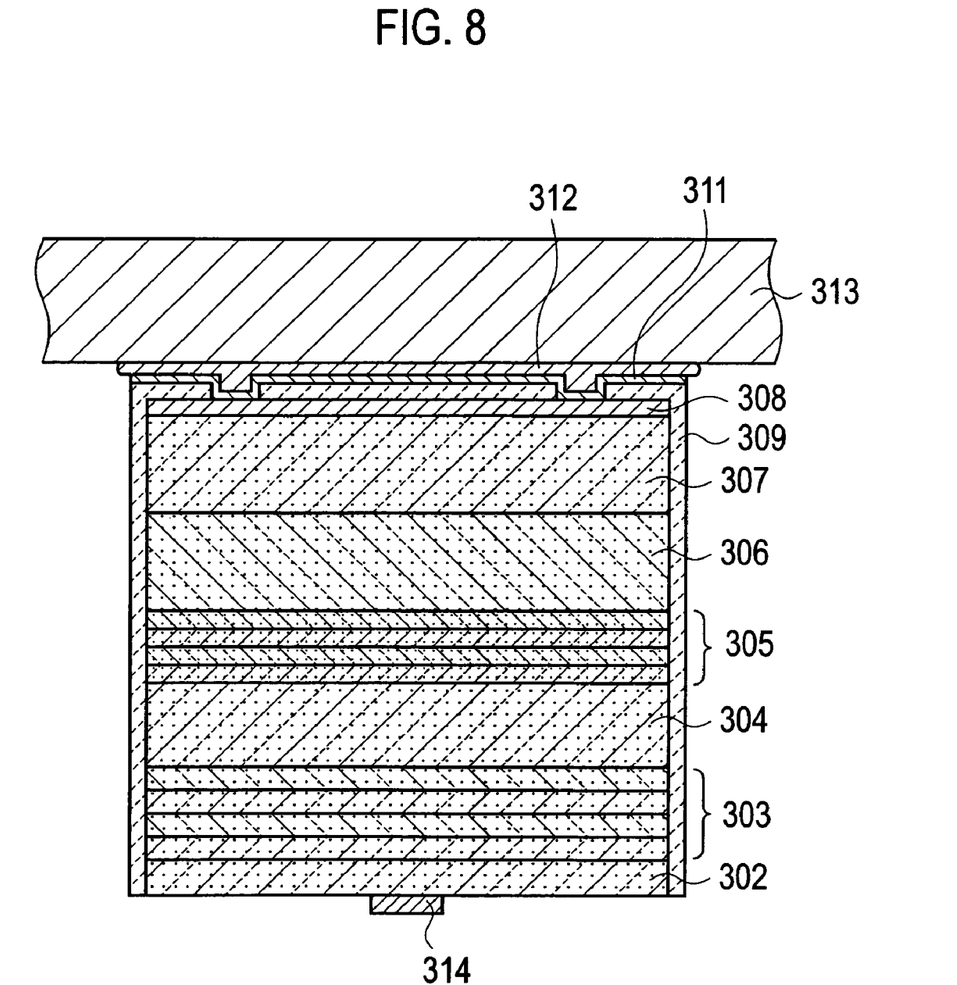
FIG. 8 is a view showing the sectional structure of a nitride semiconductor device according to a third embodiment of the present invention.

A nitride semiconductor device according to a third embodiment of the present invention will further be described below with reference to FIG. 8.

Note that the differences from the first embodiment described above will mainly be described below.

In the first embodiment, on the n-type GaN contact layer 102, the n-type AlGaN layer 103 formed of Si-doped $Al_{0.08}GaN$ and generates the electron accumulation layer, is formed as the generating layer.

In contrast, in the third embodiment, on an n-type GaN contact layer 302, an InGaN/GaN superlattice layer 303 is formed as the generating layer. The InGaN/GaN superlattice layer 303 has a superlattice structure in which an $In_xGa_{1-x}N$ (0<x<1) layer and an $In_yGa_{1-y}N$ (0≦y<1, y<x) layer of different composition formulas are alternately laminated on each other, and each of the $In_xGa_{1-x}N$ layer and the $In_yGa_{1-y}N$ layer has a thickness of less than or equal to 30 nm.

For example, the InGaN/GaN superlattice layer 303 is formed to have a superlattice structure in which an InGaN layer formed of Si-doped $In_{0.05}GaN$ with a thickness of less than or equal to 30 nm per layer, and a GaN layer formed of Si-doped GaN with a thickness of less than or equal to 30 nm per layer are alternately laminated on the n-type GaN contact layer 302.

Note that undoped InGaN layers and undoped GaN layers may also be used instead of the Si-doped InGaN layers and Si-doped GaN layers.

Accordingly, the n-type semiconductor layer includes the n-type GaN contact layer 302 formed of Si-doped GaN having an electron concentration ranging from $5 \times 10^{16}$ cm$^{-3}$ to $5 \times 10^{18}$ cm$^{-3}$, and the InGaN/GaN superlattice layer 303 having the superlattice structure in which the InGaN layer with a thickness of less than or equal to 30 nm per layer and a GaN layer with a thickness of less than or equal to 30 nm per layer are alternately laminated on the n-type GaN contact layer 302. Thereby, when the electric current flows between an n-electrode 314 and a transparent electrode 308, and when the transparent electrode is a p-electrode, the InGaN/GaN superlattice layer 303 functions as the generating layer which generates the electron accumulation layer. Accordingly, the electrons can be further accumulated two-dimensionally near the boundary surface of the n-type GaN contact layer 302 and the InGaN/GaN superlattice layer 303, and the electron accumulation layer having low resistance can be generated.

Accordingly, the electric current from the n-electrode 314 diffuses into the entire electron accumulation layer further promptly approximately in the horizontal direction in relation to the crystal growth direction, when the electric current flows between the n-electrode 314 and the transparent electrode 308 in the nitride semiconductor device. The electric current diffused via the electron accumulation layer uniformly flows to the MQW active layer 305 and diffuses in the entire nitride semiconductor layer, thus allowing the MQW active layer 305 to emit the light evenly. Accordingly, the nitride semiconductor device, which has enhanced luminescence characteristics and a thin layer thickness of the n-type semiconductor layer between the n-electrode 314 and the NQW active layer 305, can be obtained.

(Nitride Semiconductor Device According to Fourth Embodiment of the Present Invention)

Figure 9:
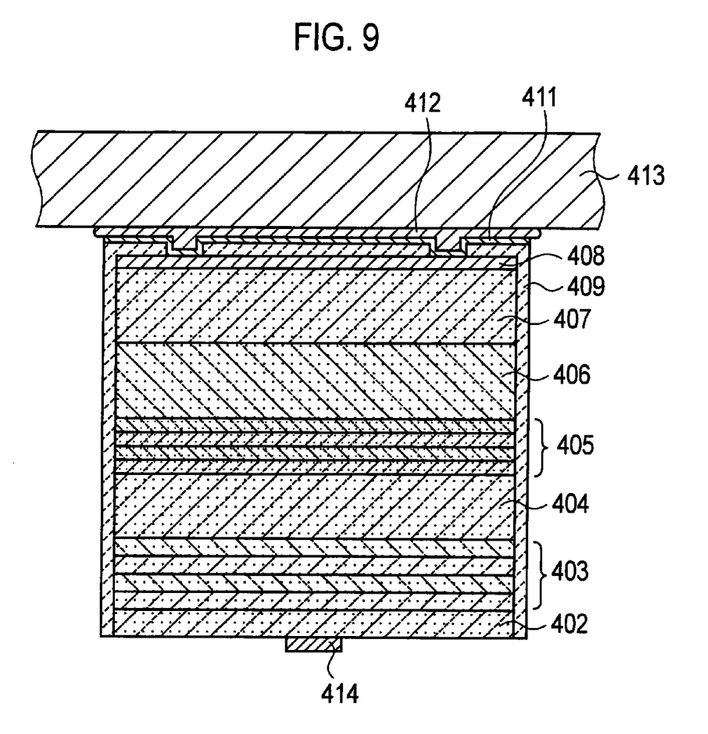
FIG. 9 is a view showing the sectional structure of a nitride semiconductor device according to a fourth embodiment of the present invention.

A nitride semiconductor device according to a fourth embodiment of the present invention will further be described below with reference to FIG. 9.

Note that the differences from the first embodiment described above will mainly be described below.

In the first embodiment, the n-type AlGaN layer 103, which is formed of Si-doped $Al_{0.08}GaN$ and functions as the generating layer generating the electron accumulation layer, is formed as the generating layer on the n-type GaN contact layer 102.

In contrast, in the fourth embodiment, on an n-type GaN contact layer 402, an InGaN/AlGaN superlattice layer 403 is formed as the generating layer. The InGaN/AlGaN superlattice layer 403 has a superlattice structure in which an $In_xGa_{1-x}N$ (0<x<1) layer and an $Al_yGa_{1-y}N$ (0<y<1) layer are alternately laminated on each other, and the $In_xGa_{1-x}N$ layer and the $Al_yGa_{1-y}N$ layer each have a thickness of less than or equal to 30 nm.

For example, the InGaN/AlGaN superlattice layer 403 is formed to have a superlattice structure in which an InGaN layer formed of Si-doped $In_{0.05}GaN$ with a thickness of less than or equal to 30 nm per layer and an AlGaN layer formed of Si-doped $Al_{0.02}GaN$ with a thickness of less than or equal to 30 nm per layer are alternately laminated on the n-type GaN contact layer 402.

Note that undoped InGaN layers and undoped AlGaN layers may also be used instead of the Si-doped InGaN layers and Si-doped AlGaN layers in the InGaN/AlGaN superlattice layer 403.

Accordingly, the n-type semiconductor layer includes the n-type GaN contact layer 402 formed of Si-doped GaN having an electron concentration ranging from $5 \times 10^{16}$ cm$^{-3}$ to $5 \times 10^{18}$ cm$^{-3}$, and the InGaN/AlGaN superlattice layer 403 having the superlattice structure in which the InGaN layer with a thickness of less than or equal to 30 nm per layer and an AlGaN layer with a thicknesses of less than or equal to 30 nm per layer are alternately laminated on the n-type GaN contact layer 402. Thereby, when the electric current flow between an n-electrode 414 and a transparent electrode 408 and when the transparent electrode 408 is a p-electrode, the InGaN/AlGaN superlattice layer 403 functions as the generating layer which generates an electron accumulation layer. Accordingly, the electrons can be further accumulated two-dimensionally near the boundary surface of the n-type GaN contact layer 402 and the InGaN/AlGaN superlattice layer 403, and the electron accumulation layer having low resistance can be generated.

Accordingly, the electric current from the n-electrode 414 diffuses into the entire electron accumulation layer further promptly approximately in the horizontal direction in relation to the crystal growth direction, when the electric current flows between the n-electrode 414 and the transparent electrode 408 in the nitride semiconductor device. The electric current diffused via the electron accumulation layer uniformly flows to the MQW active layer 405 and diffuses in the entire nitride semiconductor layer, thus allowing the MQW active layer 405 to emit the light evenly. Accordingly, the nitride semiconductor device, which has enhanced luminescence characteristics and a thin layer thickness of the n-type semiconductor layer between the n-electrode 414 and the NQW active layer 405, can be obtained.

OTHER EMBODIMENTS

The present invention has been described by the embodiments described above, but the descriptions and drawings forming a part of this disclosure should not be construed to limit the invention. This disclosure will reveal various alternative embodiments, examples, and applications to those skilled in the art.

For example, in the first embodiment, the n-type AlGaN layer 103 formed of Si-doped $Al_{0.08}GaN$ is formed as the generating layer on the n-type GaN contact layer 102, but the present invention is not limited thereto.

As the generating layer, an AlGaN/GaN superlattice layer may also be formed on the n-type GaN contact layer 102. The AlGaN/GaN superlattice layer has a superlattice structure in which an $Al_xGa_{1-x}N$ ($0<x<1$) layer and an $Al_yGa_{1-y}N$ ($0 \leq y<1$, $y<x$) layer of different composition formulas are alternately laminated on each other, and the $Al_xGa_{1-x}N$ layer and the $Al_yGa_{1-y}N$ layer each have a thickness of less than or equal to 30 nm.

For example, the AlGaN/GaN superlattice layer may be formed to have a superlattice structure in which the AlGaN layers formed of Si-doped $Al_{0.02}GaN$ with a thickness of less than or equal to 30 nm per layer and the GaN layers formed of Si-doped GaN with a thickness of less than or equal to 30 nm per layer are alternately laminated on the n-type GaN contact layer 102.

Also, undoped AlGaN layers and undoped GaN layers may be used instead of the Si-doped AlGaN layers and Si-doped GaN layers doped with Si in the AlGaN/GaN superlattice layer.

Accordingly, an n-type semiconductor layer includes an n-type GaN contact layer formed of Si-doped GaN having an electron concentration ranging from $5 \times 10^{16}$ cm$^{-3}$ to $5 \times 10^{18}$ cm$^{-3}$, and the AlGaN/GaN superlattice layer having the superlattice structure in which the AlGaN layer with a thickness of less than or equal to 30 nm per layer and a GaN layer with a thickness of less than or equal to 30 nm per layer are alternately laminated on the n-type GaN contact layer. Thereby, when the electric current flows between an n-electrode and a transparent electrode and when the transparent electrode is a p-electrode, the AlGaN/GaN superlattice layer functions as the generating layer which generates an electron accumulation layer. Accordingly, the electrons can be further accumulated two-dimensionally near the boundary surface of the n-type GaN contact layer and the AlGaN/GaN superlattice layer, and the electron accumulation layer having low resistance can be generated.

It has been described that the nitride semiconductor layer is formed by the crystal growth by using the MOCVD method in the first embodiment, but the present invention is not limited thereto. The nitride semiconductor layer may also be formed by a crystal growth by using an HVPE method, a gas source MBE method, or the like. In addition, the crystal structure of the nitride semiconductor layer may be a wurtzite or zinc blend structure. Additionally, the plane direction of the crystal growth is not limited to be [0001], and may also be [11-20] or [1-100].

Further, in the first embodiment, the substrate 100 formed of the sapphire is used as the substrate for the nitride semiconductor layer, but the present invention is not limited thereto. A substrate by which a growth of the nitride semiconductor layer can be obtained, e.g., SiC, ZnO, LAO, spinel, $AL_xGa_{1-x}N$ ($0<X \leq 1$), and the like, may also be used.

Furthermore, in the first embodiment, the KrF laser is used in the process of separating, but the process of separating may also be performed with other excimer lasers (ArF: about 193 nm wavelength, XeCl: about 308 nm wavelength, YAG third harmonic: about 355 nm wavelength, sapphire titanium third harmonic: about 360 nm wavelength, He—Cd: about 325 nm wavelength) or the like.

As has been described, it is obvious that the present invention includes various embodiments and the like which are not described herein in this manner. Thus, the technical scope of the present invention is defined only by claimed elements of the invention according to the appropriate scope of the claims on the basis of the descriptions above.

EXAMPLES

Next, the present invention will further be described in detail by use of examples, but the present invention is not in any way limited to the examples to be described below.

Example 1, Example 2, and Comparative Example 1

A nitride semiconductor device including at least an n-electrode, an n-type semiconductor layer, an active layer, and a p-type semiconductor layer laminated in this order was fabricated, such that the nitride semiconductor device includes an n-type GaN contact layer formed of Si-doped GaN having an electron concentration shown in Table 1, the n-electrode provided on one of the main surfaces of the n-type GaN contact layer, and a generating layer provided on the other main surface of the n-type GaN contact layer and formed of $Al_xGa_{1-x}N$ ($0<x<1$), the generating layer generating an electron accumulation layer at the boundary surface with the n-type GaN contact layer.

Specifically, in the process of laminating the n-type GaN contact layer shown in FIG. 2, the substrate 100 was firstly put in a metal organic chemical vapor deposition (MOVCD) device, and the thermal cleaning was performed on the substrate 100 by increasing the temperature to approximately 1050° C. while causing hydrogen gas to flow.

Secondly, the temperature in the MOCVD device was reduced to approximately 600° C., forming, by a crystal growth, an n-type buffer layer 101 which is formed of GaN, on the substrate 100.

Thirdly, the temperature in the MOCVD device was increased again to approximately 1000° C., to form the n-type GaN contact layer 102 by the crystal growth, on the n-type buffer layer 101. The n-type GaN contact layer 102 is formed of Si-doped GaN having an electron concentration $1 \times 10^{17}$ cm$^{-3}$. Then, the process of laminating the generating layer to the process of forming the n-electrode was performed so as to manufacture the nitride semiconductor device according to Example 1.

In a similar manner, a nitride semiconductor device according to Example 2 was manufactured. The nitride semiconductor device according to Example 2 includes an n-type GaN contact layer, which is formed of Si-doped GaN having an electron concentration of $1 \times 10^{18}$ cm$^{-3}$.

In a similar manner, a nitride semiconductor device of Comparative Example 1 was manufactured. The nitride semiconductor device of Comparative Example 1 includes an n-type GaN contact layer, which is formed of Si-doped GaN having an electron concentration of $1 \times 10^{19}$ cm$^{-3}$.

Measurements of a degree of electron transfer, an electrical conductivity, an electrical resistance, and the brightness were performed on the nitride semiconductor devices. Results of the measurements are shown in Table 1 and FIG. 10.

TABLE 1

| Unit | Electron concentration cm$^{-3}$ | Electron Mobility cm$^2$/Vs | Electrical conductivity | Electrical resistivity Ω cm |
|---|---|---|---|---|
| Example 1 | 1.00E+17 | 600 | 9.60E+02 | 1.04E−01 |
| Example 2 | 1.00E+18 | 250 | 4.00E+03 | 2.50E−02 |
| Comparative Example 1 | 1.00E+19 | 100 | 1.60E+04 | 6.25E−03 |

As shown in Table 1, the nitride semiconductor devices of Example 1, Example 2, and Comparative Example 1, which includes the n-type GaN contact layer formed of Si-doped GaN having an electron concentration ranging from $1 \times 10^{17}$ cm$^{-3}$ to $1 \times 10^{19}$ cm$^{-3}$, showed a low electrical resistance and an improved electron mobility.

Figure 10:
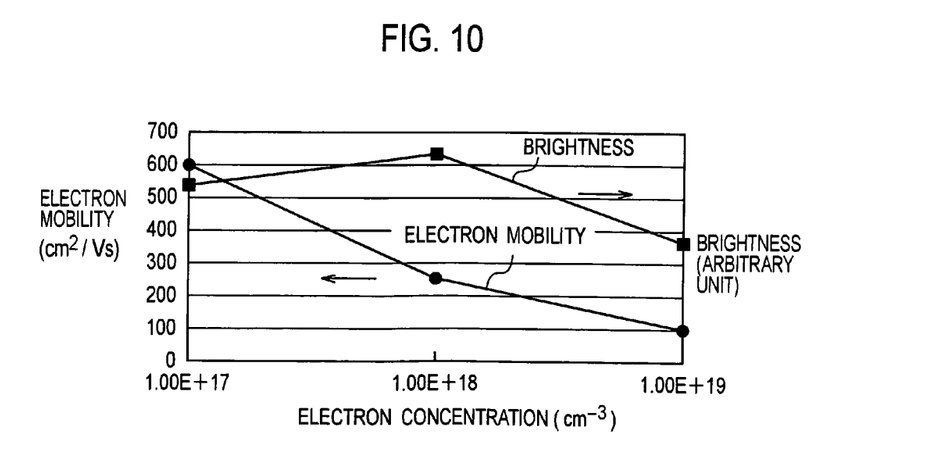
FIG. 10 is a view showing the electron transfer rate and the brightness of a nitride semiconductor device according to an example.

As shown in FIG. 10, the nitride semiconductor device of the Example 2 particularly showed an excellent electron mobility and the brightness.

In contrast, the nitride semiconductor device of the Comparative Example 1 showed a low electron mobility and the brightness, as compared to the nitride semiconductor device of Example 2. Accordingly, it has been found that the brightness of the nitride semiconductor device decreases and thereby a sufficient light emitting characteristic cannot be obtained when the electron concentration of the n-type GaN contact layer of the nitride semiconductor device is greater than or equal to $5 \times 10^{18}$ cm$^{-3}$.

Also, it has been found that the brightness of the nitride semiconductor device decreases and thereby a sufficient light emitting characteristic cannot be obtained when the electron concentration of the n-type GaN contact layer is less than or equal to $5 \times 10^{16}$ cm$^{-3}$, assuming that a similar change in the brightness occurs in the nitride semiconductor device including the n-type GaN contact layer formed of Si-doped GaN having an electron concentration of less than or equal to $1 \times 10^{17}$ cm$^{-3}$, as the change in the brightness occurred in the nitride semiconductor device having an electron concentration ranging from $1 \times 10^{17}$ cm$^{-3}$ to $1 \times 10^{19}$ cm$^{-3}$

INDUSTRIAL APPLICABILITY

According to the present invention, a nitride semiconductor device, which has enhanced luminescence characteristics and a thin layer thickness of an n-type semiconductor layer between an n-electrode and an active layer can be provided.

The invention claimed is:

1. A nitride semiconductor device, comprising:
at least an n-electrode;
an n-type semiconductor layer;
an active layer;
a p-type semiconductor layer; and
a p-electrode sequentially,
wherein the n-type semiconductor layer includes an n-type GaN contact layer of n-type impurity-doped GaN having an electron concentration ranging from $5 \times 10^{16}$ cm$^{-3}$ to $5 \times 10^{18}$ cm$^{-3}$, and a generating layer comprised of at least one of Al$_x$Ga$_{1-x}$N (0<x<1) and In$_x$Ga$_{1-x}$N (0<x<1),
wherein the n-electrode is provided on one main surface of the n-type GaN contact layer
wherein the p-electrode is a transparent electrode and is provided on one main surface of the p-type semiconductor layer,
wherein the nitride semiconductor device further comprises:
an electron accumulation layer provided on another main surface of the n-type GaN contact layer for accumulating electrons at a boundary surface with the n-type GaN contact layer;
a reflecting mirror film provided on the p-electrode;
an adhesive film provided on the reflecting mirror film; and
a supporting substrate bonded to the reflecting mirror film via the adhesive film,
wherein the generating layer is provided on another main surface of the n-type GaN contact layer and generates an electron accumulation layer for accumulating electrons at a boundary surface with the n-type GaN contact layer.

2. The nitride semiconductor device according to claim 1, wherein
the generating layer has a superlattice structure in which an Al$_x$Ga$_{1-x}$N (0<x<1) layer and an Al$_y$Ga$_{1-y}$N (0≦y<1, y<x) layer, which have different composition formulas from one another, are alternately laminated on each other, and wherein the Al$_x$Ga$_{1-x}$N layer and the Al$_y$Ga$_{1-y}$N layer each has a thickness that is equal to or less than 30 nm.

3. The nitride semiconductor device according to claim 1, wherein the generating layer has a superlattice structure in which an In$_x$Ga$_{1-x}$N (0<x<1) layer and an Al$_y$Ga$_{1-y}$N (0<y<1) layer are alternately laminated on each other, and wherein the In$_x$Ga$_{1-x}$N layer and the Al$_y$Ga$_{1-y}$N layer each has a thickness that is equal to or less than 30 nm.

4. The nitride semiconductor device according to claim 1, wherein the generating layer has a superlattice structure in which an In$_x$Ga$_{1-x}$N (0<x<1) layer and an In$_y$Ga$_{1-y}$N (0≦y<1, y<x) layer, which have different composition formulas from one another, are alternately laminated on each other, and wherein the In$_x$Ga$_{1-x}$N layer and the In$_y$Ga$_{1-y}$N layer each has a thickness that is equal to or less than 30 nm.

5. The nitride semiconductor device according to claim 1, wherein the n-electrode is connected only to a part of said one main surface of the n-type GaN contact layer.

6. The nitride semiconductor device according to claim 1, wherein the p-electrode is connected to the p-type semiconductor layer;
and wherein the nitride semiconductor device further comprises:
an insulating film that is formed at least on the p-electrode and that includes at least one contact hole that exposes at least a portion of the p-electrode; and
a reflective mirror film that is formed on the insulating layer, the walls of the at least one contact hole and the exposed at least one portion of the p-electrode, and that includes at least one portion that contacts and connects with the p-electrode.

7. The nitride semiconductor device according to claim 6, wherein the reflective mirror film is a metal film.

* * * * *